US008766815B2

(12) United States Patent
Di Giovine

(10) Patent No.: US 8,766,815 B2
(45) Date of Patent: Jul. 1, 2014

(54) LIGHT SIGNALING DEVICE

(76) Inventor: Vincenzo Di Giovine, Lecco (IT)

( * ) Notice: Subject to any disclaimer, the term of this patent is extended or adjusted under 35 U.S.C. 154(b) by 149 days.

(21) Appl. No.: 13/599,008

(22) Filed: Aug. 30, 2012

(65) Prior Publication Data

US 2013/0049980 A1 Feb. 28, 2013

(30) Foreign Application Priority Data

Aug. 30, 2011 (IT) .............................. PD2011A0277

(51) Int. Cl.

| | |
|---|---|
| ***G08B 5/00*** | (2006.01) |
| ***G09F 9/33*** | (2006.01) |
| ***B60Q 1/26*** | (2006.01) |
| ***H04B 10/00*** | (2013.01) |
| ***H03K 3/00*** | (2006.01) |

(52) U.S. Cl.
USPC ................ 340/815.45; 340/815.5; 340/815.4; 340/472; 340/468; 340/473; 398/135; 320/108; 327/109

(58) Field of Classification Search
CPC ..... B60Q 1/2657; G08B 7/066; F21V 29/004
USPC ............. 340/815.45, 468, 471, 473; 398/135; 327/109
See application file for complete search history.

(56) References Cited

U.S. PATENT DOCUMENTS

| | | | | |
|---|---|---|---|---|
| 3,869,641 | A * | 3/1975 | Goldberg | 315/135 |
| 2007/0164875 | A1* | 7/2007 | Fredericks et al. | 340/815.45 |
| 2012/0146813 | A1* | 6/2012 | Gilmore | 340/907 |

FOREIGN PATENT DOCUMENTS

| | | | |
|---|---|---|---|
| DE | 20317373 | U1 | 1/2004 |
| DE | 102008003703 | A1 | 7/2009 |
| WO | 2004/070266 | A1 | 8/2004 |

OTHER PUBLICATIONS

Search Report of the Italian Priority Application No. PD2011A000277 dated Mar. 20, 2012.

* cited by examiner

*Primary Examiner* — Fekadeselassie Girma
(74) *Attorney, Agent, or Firm* — Browdy and Neimark, PLLC

(57) ABSTRACT

A light signaling device including a tubular body having an outer surface to which LEDs are mechanically connected. An inner surface of the body defines a channel inside the tubular body and has a heat dissipation unit through which the heat generated by the LEDs is dissipated. The light signaling device also comprises a lower air conveyor mechanically connected to the lower edge of the tubular body, partially closing the lower opening of the inner channel of the tubular body and is provided with separate conveyance channels, each of which extended between an inlet section thereof and an outlet section thereof according to a trajectory which has at least one component radial with respect to the main extension axis. Each of the conveyance channels is in communication with the light signaling device exterior via the inlet section and with the lower opening of the inner channel via the outlet section.

15 Claims, 10 Drawing Sheets

LIGHT SIGNALING DEVICE

FIELD OF APPLICATION

The present invention regards a light signaling device, according to the preamble of the independent claim.

The present light signaling device is situated in the industrial field of the production of signaling devices and systems equipped with light sources of LED type, and it is intended to be advantageously employed in order to better indicate to aircraft the presence of high structures, such as smokestacks, bridges or the like.

In particular, the aforesaid light signaling device is advantageously employed for indicating the presence of towers or other high buildings, especially those situated in urban areas.

STATE OF THE ART

Light signaling devices are known on the market today that are mounted (for example) on towers, smokestacks of industrial plants, on bridges, pylons or on other structures which rise considerably with respect to the ground, in order to indicate the presence of obstacles to aircraft such as airplanes, helicopters etc.

A first conventional light signaling device is provided with a xenon lamp.

Such first signaling device comprises a support body which bears the xenon lamp, and a transparent or translucent cap fixed to the support body which covers the xenon lamp in order to protect it from the outside environment.

Even if appreciated for the high light intensity that the xenon lamp is capable of emitting, this first light signaling device has a drawback which is constituted by the brief lifetime of the xenon lamp.

Indeed, the xenon lamp of this conventional first light signaling device has a lifetime that is generally comprised between 700 and 1000 functioning hours.

Such drawback is particularly serious when this first light signaling device is installed in sites where maintenance is difficult or dangerous, such as at the top of smokestacks, towers or pylons.

Indeed, in such sites, the substitution of the aforesaid lamp requires high costs, mainly connected with the difficult accessibility of the lamp and the safety expedients that may be necessary to ensure the safety of the substitution operators.

Due to the brief lifetime of the xenon lamp, the costs relative to such first light signaling device are high, due to the frequent substitution operations of the lamp itself.

Instead of a xenon lamp, a second light signaling device known today is provided with light emitting diodes, LEDs, as described below.

Conventionally, the LEDs have a much longer lifetime than that of the xenon lamps.

Nevertheless, the lifetime of the LEDs and the light intensity they emit, given the same electric power absorbed, decrease with the increase of their functioning temperature.

For this reason, the aforesaid second light signaling device comprises heat dissipation means connected with the LEDs in order to cool them, as will be more fully described below.

This second light signaling device is described in particular in the patent application published with the number US 2009/0040759.

In this patent application, a light signaling device is described which comprises a tubular body, which has a lower edge and an upper edge and is extended between the lower edge and the upper edge along a main extension axis.

The aforesaid tubular body also has an outer surface and an inner surface which defines a channel inside the tubular body.

This inner channel is susceptible to having an air flow for cooling the LEDs flow through it.

In particular, the aforesaid inner channel has a lower opening arranged at the lower edge of the aforesaid tubular body, and an upper opening arranged at the aforesaid upper edge.

This second conventional light signaling device comprises LEDs mechanically connected to the outer surface of the tubular body, these LEDs being susceptible to dissipating heat via conduction through the tubular body, which is cooled by the aforesaid air flow which flows through the inner channel.

Heat dissipation means are mechanically connected to the inner surface of the tubular body of this second known light signaling device, such heat dissipation means being susceptible to dissipating the heat generated by the LEDs inside the aforesaid inner channel.

More in detail, the heat dissipation means comprise a second metal tubular body and a plurality of heat ducts which connect the first tubular body with the second tubular body.

Conventionally, this second tubular body is externally provided with a plurality of metal dissipation fins spaced from the inner surface of the first tubular body.

Conventionally, the aforesaid heat ducts are arranged to thermally connect the first tubular body with the second tubular body.

In particular, each heat duct has a substantially U-shaped form and is composed of a first branch welded to the inner surface of the aforesaid first tubular body, and of a second branch fixed to the aforesaid second tubular body.

In addition, in an entirely conventional manner, each of these heat ducts comprises a connection portion of the two aforesaid branches; such connection portion is extended by surmounting the metal dissipation fins of the second tubular body.

Operatively, when this second light signaling device is in function, the heat generated by the LEDs during their functioning is partly transmitted directly to the environment outside the first metal tubular body, and is partly transmitted via conduction, by means of the heat ducts, to the dissipation fins of the second tubular body.

These dissipation fins transmit heat to an air flow that crosses through the aforesaid inner channel of the first tubular body; such air flow transports, via convection, the heat received from the dissipation fins to the environment outside the aforesaid light signaling device.

One drawback of this second light signaling device consists of the fact that the dissipation of the heat produced by the LEDs during their functioning is not very efficient, since the aforesaid air flow that crosses through the channel of the first tubular body proceeds slowly and tends to assume a mainly laminar progression.

A third light signaling device is described below, it too provided with LEDs and heat dissipation means for the heat generated by the LEDs.

This third light signaling device comprises a tubular body which has a lower edge and an upper edge and is extended between these edges along a main extension axis.

Conventionally, the aforesaid tubular body has an outer surface and an inner surface which defines a channel inside the tubular body. This inner channel has a lower opening arranged at the lower edge of the aforesaid tubular body, and an upper opening arranged at the aforesaid upper edge.

Such third light signaling device is provided with LEDs which are mechanically connected to the outer surface of the tubular body, these LEDs being susceptible to dissipating heat via conduction through the tubular body.

The heat dissipation means are housed in the inner channel of the aforesaid tubular body; such heat dissipation means are constituted by a plurality of metal dissipation fins mechanically connected to the inner surface of the tubular body, in order to dissipate the heat generated by the LEDs in an air flow passing through the same inner channel.

When the third signaling device is installed in the use seat, the aforesaid tubular body is completely open at both ends thereof, i.e. at the aforesaid upper and lower edges of the tubular body; this signifies that the upper opening and the lower opening of the aforesaid inner channel have a diameter substantially equal to the diameter of the tubular body itself.

In addition, this third light signaling device comprises a plurality of direction lenses, each of which fixed on the outer surface of the tubular body in front of each corresponding LED in order to collimate the light emitted by the latter into horizontal light bands.

Such third light signaling device also conventionally comprises a transparent cylindrical sheet arranged around the outer surface of the tubular body to protect the LEDs. The latter are controlled by a control unit positioned between the tubular body and the cylindrical transparent sheet.

This third light signaling device has also proven to have drawbacks in practice.

In particular, this third light signaling device has a drawback that consists of the fact that the dissipation of the heat produced by the LEDs during their functioning is not very efficient, since the aforesaid air flow, which crosses through the channel of the tubular body, proceeds slowly and tends to assume a mainly laminar progression—which is well-known to be inefficient for obtaining a high heat exchange via convection.

In addition, when this third light signaling device is hit by a strong wind which hits it transversely with respect to the main extension axis of its tubular body, the turbulence produced by such wind at the upper and lower openings of the inner channel obstructs the flow of air in the inner channel itself, further reducing the efficiency of the dissipation via convection of the heat generated by the LEDs during their functioning.

A fourth light signaling device is also known, described in the patent DE 20317373. This signaling device comprises a tubular body provided with an outer surface, on which a plurality of LEDs are mounted, and an inner surface defining a channel inside the tubular body itself.

The fourth light signaling device also comprises a containment body, inside of which the tubular body is arranged. More in detail, the containment body comprises an abutment base, bearing the tubular body fixed and provided with a first central opening aligned with the inner channel of the tubular body itself, and a transparent dome sealingly fixed on the abutment base and provided with a second central opening also aligned with the inner channel of the tubular body.

The fourth light signaling device also comprises a support pedestal bearing the abutment base of the containment body mounted thereon. More in detail, the support pedestal comprises a hollow column which is closed at the lower end by an enlarged support plate and is fixed at the upper end to the support base of the containment body. In addition, the hollow column is positioned aligned with the first central opening of the abutment base and with the inner channel of the tubular body, and is provided with four lateral openings for allowing the entrance of the air in the inner channel of the tubular body itself.

The main drawback of this fourth light signaling device of known type is due to the fact that the lateral openings of the hollow column only allow the entrance of a weak air flow in the inner channel of the tubular body. In particular, above all in the presence of strong wind, the air which enters through one of the lateral openings of the hollow column escapes from the lateral openings positioned on the opposite side of the column, hence without entering into the inner channel of the tubular body. This involves a low efficiency of the dissipation via convection of the heat generated by the LEDs during their functioning.

PRESENTATION OF THE INVENTION

In this situation, the essential object of the present invention is therefore that of overcoming the drawbacks manifested in the solutions of known type, by providing a light signaling device that is capable of functioning in a more efficient and reliable manner with respect to the conventional light signaling devices described above.

Further object of the present invention is to provide a light signaling device that is capable of removing the heat generated by the LEDs with greater efficiency with respect to the conventional light signaling devices described above.

Another object of the present invention is to provide a light signaling device that allows being easily installed at the top of towers, smokestacks or other high constructions, in order to signal the presence thereof to aircraft.

Still another object of the present invention is to provide a light signaling device that is structurally simple and inexpensive to produce.

These and other objects are attained by a light signaling device, object of the present invention, according to the below-reported claims.

BRIEF DESCRIPTION OF THE DRAWINGS

The technical characteristics of the finding, according to the proposed objects, can be clearly found in the contents of the below-reported claims and the advantages of the same will be more evident in the detailed description of two preferred but not exclusive embodiments of a light signaling device according to the present invention, illustrated as a non-limiting example in the enclosed drawing set in which:

DETAILED DESCRIPTION OF A PREFERRED EMBODIMENT

Figure 1:
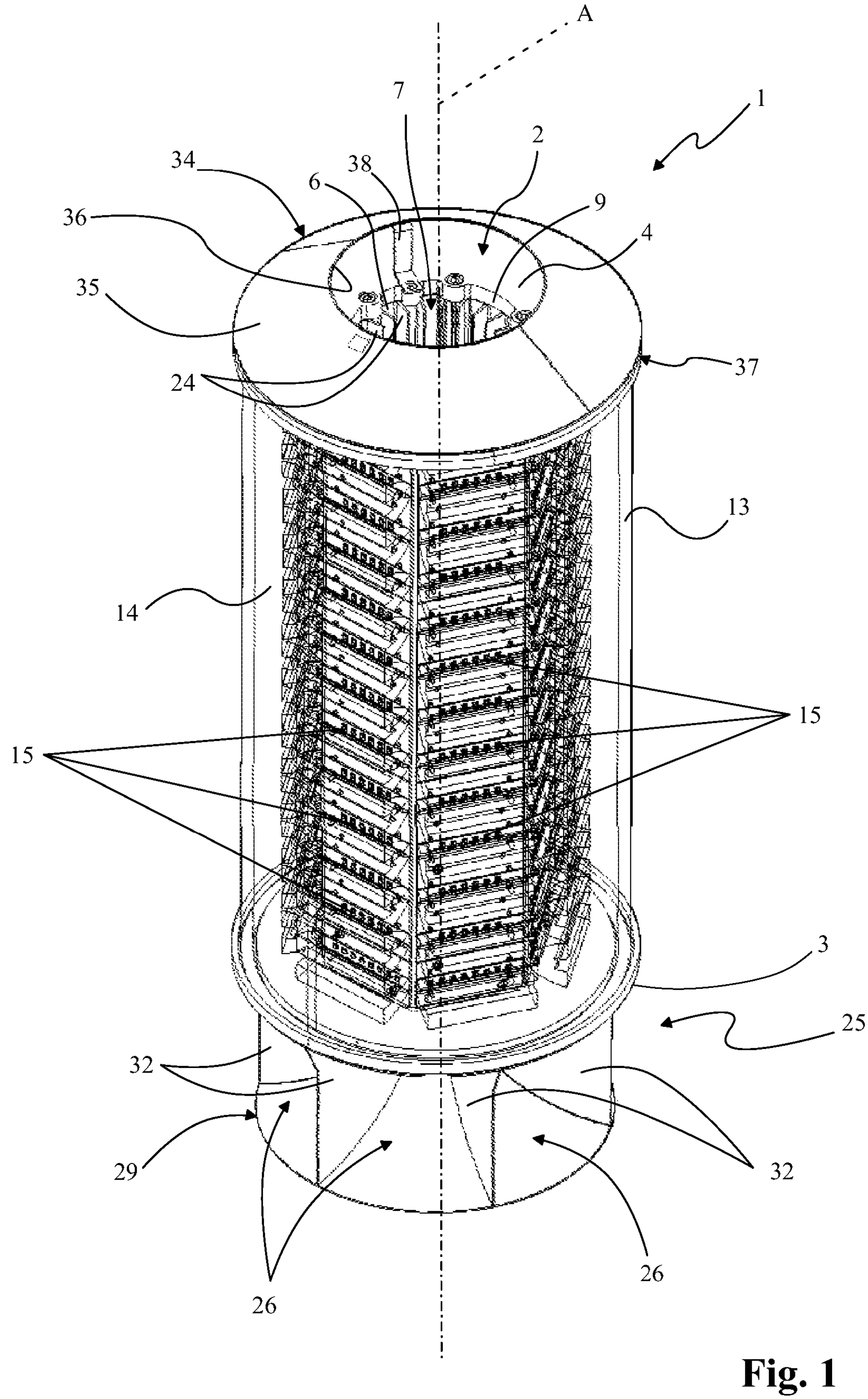
FIG. 1 illustrates, in perspective view, a light signaling device according to a first embodiment of the present invention, which has a tubular body that is internally provided with dissipation fins, which bears LED lighting modules externally mounted and which also has an upper air conveyor and a lower air conveyor.
Figure 2:
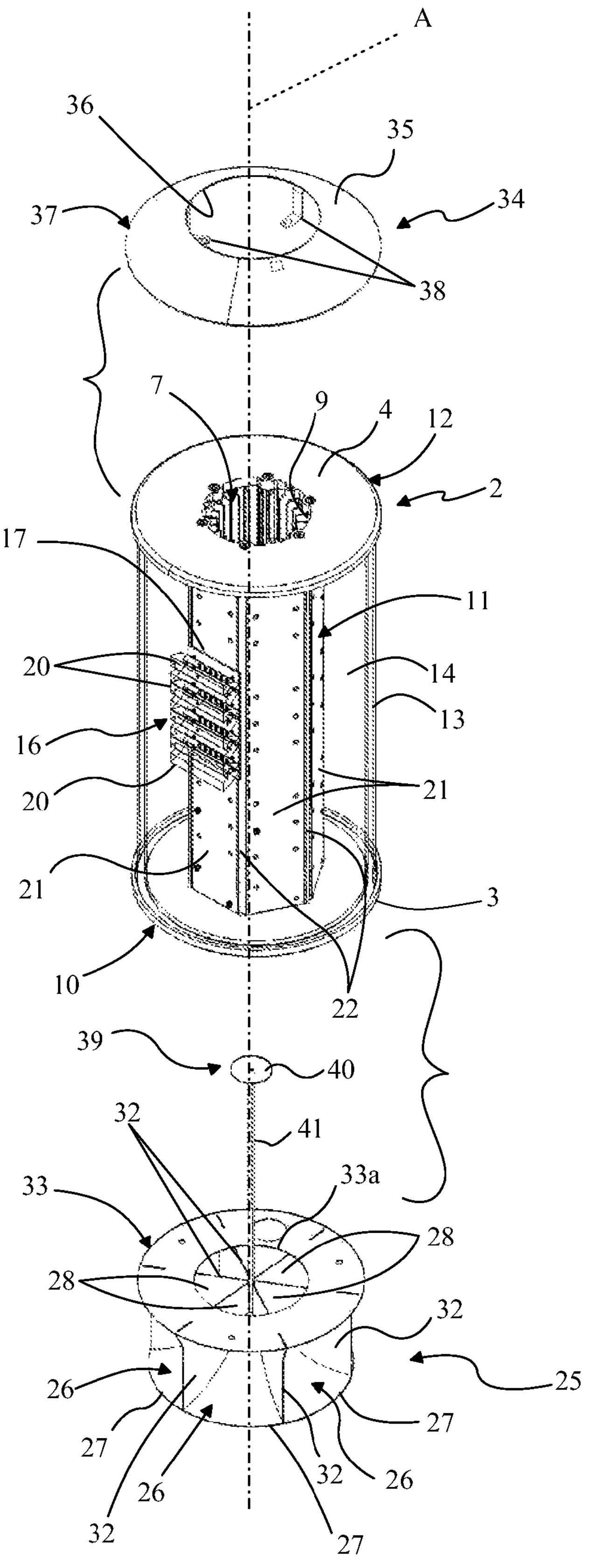
FIG. 2 illustrates, in partially exploded perspective view, the signaling device of FIG. 1 with several LED lighting modules removed in order to better show other parts of the light signaling device.
Figure 3:
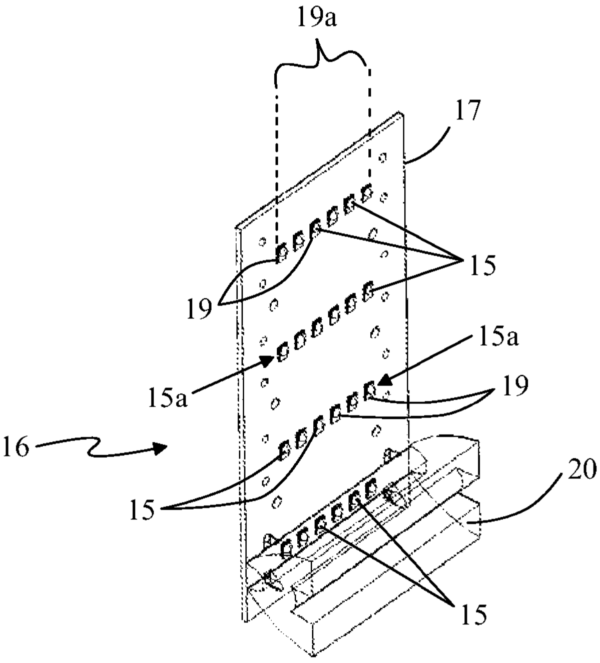
FIG. 3 illustrates, in perspective view, a particular detail relative to the light signaling device illustrated in FIG. 1, relative to an LED lighting module that comprises LED formations of which one string is covered by a lens, the lenses covering the other formations not being represented in order to better illustrate the other parts of the LED lighting module.
Figure 4:
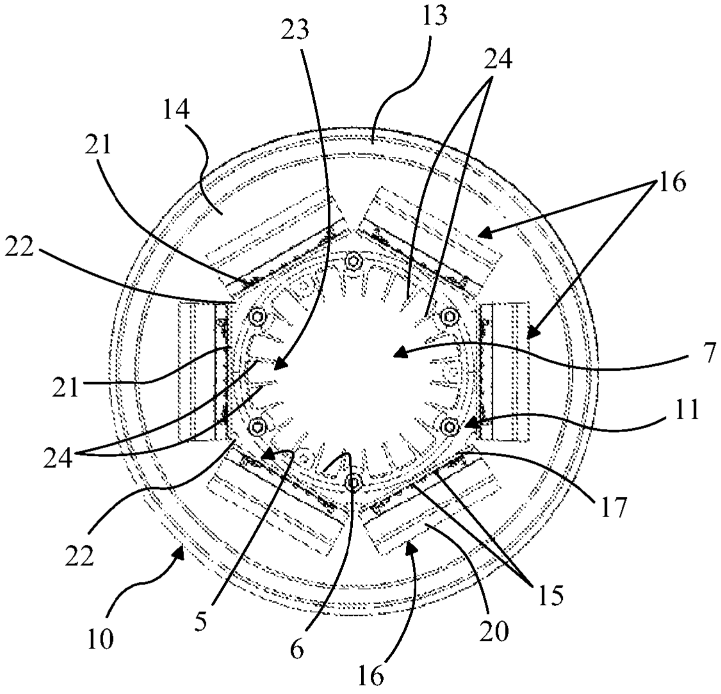
FIG. 4 illustrates the light signaling device of FIG. 1, in top plan view with several parts removed in order to better illustrate other parts.
Figure 5:
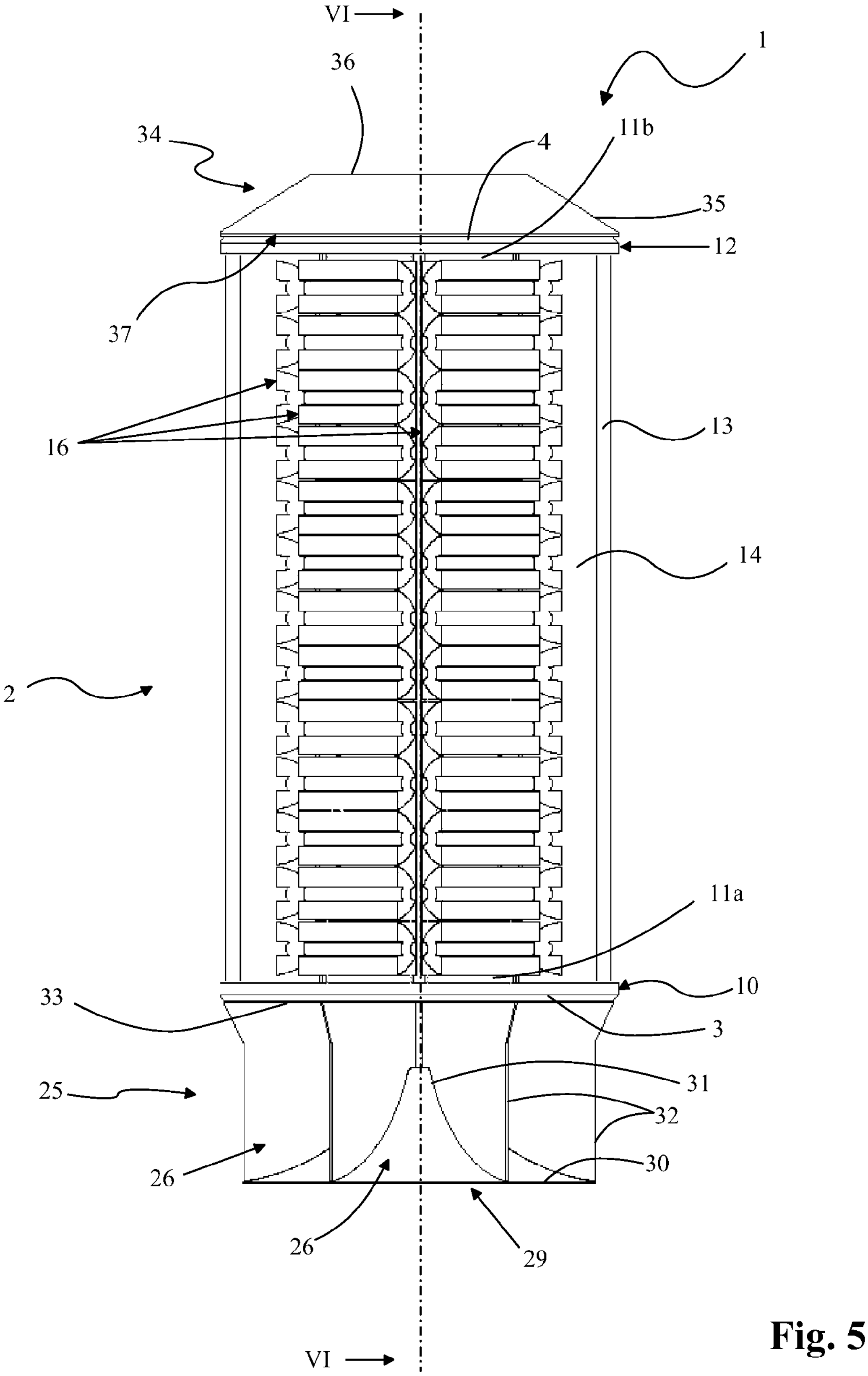
FIG. 5 illustrates the light signaling device of FIG. 1 in side elevation view.

With reference to the drawing set, a light signaling device according to a first embodiment of the present invention is indicated in its entirety with 1.

This light signaling device is situated in the industrial field of the production of signaling devices and systems provided with light sources of LED type, and is intended to be advantageously employed for indicating to aircraft the presence of high structures, such as smokestacks, bridges, towers or the like.

In particular, such light signaling device according to the present invention especially lends itself to being installed in sites where it is hit by strong winds and/or in sites where it is hit by intense heat radiation, such as at the top of smokestacks.

In addition, this light signaling device 1 also lends itself to being installed in sites where the outside temperature is high, such as on buildings situated in regions with particularly hot climates.

In addition, this light signaling device can be advantageously employed for emitting, over 360° above the horizon, a high intensity light radiation of about 200000 cd.

The light signaling device 1 comprises a tubular body 2 which has a lower edge 3 and an upper edge 4 and is extended between the lower edge 3 and the upper edge 4 along a main extension axis A.

In use conditions, the light signaling device 1 is advantageously installed with the main extension axis A substantially vertical and the upper edge 4 directed upward.

In addition, the tubular body 2 has an outer surface 5 and an inner surface 6 which defines an inner channel 7 that crosses through the tubular body 2 along the main extension axis A.

The inner channel 7 has a lower opening 8, arranged at the lower edge 3 of the tubular body 2, and an upper opening 9 which is arranged at the upper edge 4 of the tubular body 2.

More in detail, the tubular body 2 comprises, in succession along its main extension axis A: a first annular flange 10, a tubular portion 11 and a second annular flange 12.

Advantageously, the outer surface 5 of the tubular body 2 is given by the lateral face of the tubular portion 11.

The annular flanges 10 and 12 are bolted to the opposite terminal ends 11*a* and 11*b* of the tubular portion 11.

The light signaling device 1 also comprises a cylindrical sheet 13 which is light-permeable and surrounds the tubular portion 11 of the tubular body 2, in order to shield it from the outside environment.

Between the tubular portion 11 and the cylindrical sheet 13, an air space 14 is defined that is susceptible for housing LEDs 15.

The annular flanges 10 and 12 delimit the air space 14 on the upper and lower part, and are provided with perimeter edges 10*a* and 12*a* which are mechanically connected to end edges 13*a* and 13*b* of the cylindrical sheet 13, preferably by means of sealing gaskets 50, in order to seal the air space 14.

In addition, the light signaling device 1 comprises the LEDs 15 mechanically connected to the outer surface 5 of the tubular body 2.

More in detail, the light signaling device 1 preferably comprises a plurality of LED lighting modules 16 which are fixed to the outer surface 5 of the tubular body 2.

In particular, each of the LED lighting modules 16 comprises a base plate 17, which is conveniently made of metal material and is provided with a plurality of seats 19 engaged by the LEDs 15. Each base plate 17 is fixed to the outer surface 5, for example by means of screws, not illustrated in the enclosed figures.

Preferably, each LED 15 is oriented with its light emission axis orthogonal to the main extension axis A of the tubular body 2, and in particular orthogonal to the base plate 17 on which the LED 15 is mounted, in a manner such that in use conditions of the light signaling device 1, the light emission axis of each LED 15 is substantially arranged horizontal.

Advantageously, the LEDs 15 are organized in formations 15*a*.

In addition, the LED lighting modules 16 preferably comprise lenses 20 superimposed on the LEDs 15 and mechanically fixed to the base plate 17.

In particular, each formation 15*a* of LEDs 15 is conveniently covered by one of the lenses 20, which is susceptible to collimate the light emitted by the LEDs 15 in a direction substantially perpendicular to the base plate 17.

In particular, each lens 20 is positioned in front of the corresponding formation 15*a* of LEDs 15, intercepting the light emission axis of the latter, and is adapted to concentrate the light emitted by such LEDs 15 into light bands mainly oriented along an optical axis parallel to the light emission axis of the LEDs 15 themselves.

More in detail, each lens 20 produces a vertical distribution of the light bands over an angle of about 5°, preferably with an asymmetric distribution with respect to a horizontal plane that contains the optical axis of the lens 20, in particular of about 1° from the lower side of such horizontal plane and of about 4° from the upper side.

Advantageously, the outer surface 5 has a polygonal profile, preferably hexagonal, and comprises a plurality of flat faces 21 which are adjacent to each other and susceptible to receiving in abutment, in close contact, each base plate 17 of the LED lighting modules 16, in order to exchange heat with the LEDs 15 via thermal conduction.

Preferably, the tubular portion 11 of the tubular body 2 is provided with longitudinal slots 22 inserted between each flat face 21 and the flat face 21 adjacent thereto.

The longitudinal slots 22 define cable-passage channels susceptible to house the power supply cables of the LEDs 15, per se known and hence not illustrated in the enclosed figures. Operatively, the LEDs 15 are heated during their functioning and dissipate heat to the base plate 17.

This base plate 17 in turn dissipates the heat received by the LEDs 15 through the tubular body 2 by means of the flat faces 21.

The tubular body 2 exchanges the aforesaid heat with the air present in its inner channel 7; the air receiving such heat is heated and generates an ascending flow along the inner channel 7. Such ascending flow cools the tubular body 2 mainly via heat convection.

Advantageously, the light signaling device 1 also comprises heat dissipation means 23 mechanically connected to the inner surface 6 of the tubular body 2, in order to remove heat from the tubular body 2 and transfer it to the aforesaid ascending air flow that crosses the inner channel 7 of the tubular body 2 itself.

Preferably, the heat dissipation means 23 comprise a plurality of dissipation fins 24, which project inside the inner channel 7 of the tubular body 2.

Advantageously, the dissipation fins 24 are integral with the tubular portion 11 of the tubular body 2, which preferably is made of metal material.

According to the present invention, a particular feature of the light signaling device 1 is that it also comprises a lower air conveyor 25, which is mechanically connected to the lower edge 3 of the tubular body 2, partially closes the lower opening 8 of the inner channel 7 of the tubular body 2 and is provided with a plurality of separate conveyance channels 26, each of which extended between an inlet section 27 thereof and an outlet section 28 thereof according to a trajectory B which has at least one component radial with respect to the main extension axis A.

Figure 11:
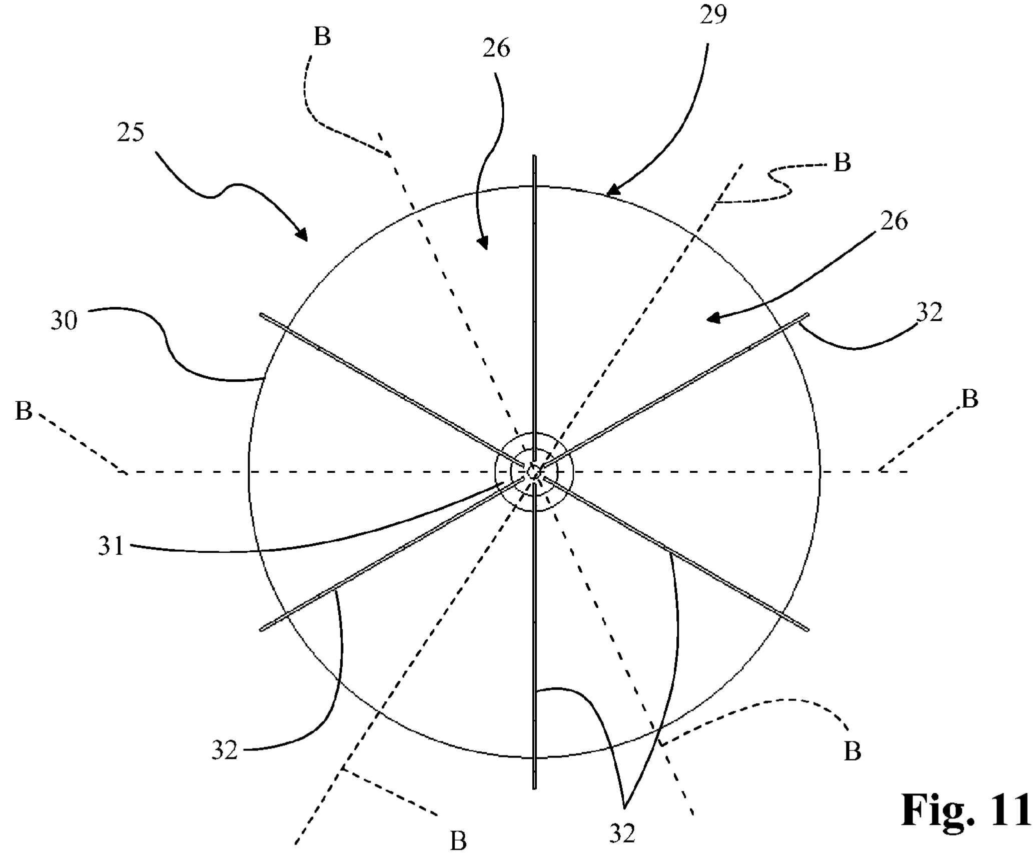
FIG. 11 illustrates, in top plan view, the particular detail of the light signaling device illustrated in FIG. 10, with several parts removed in order to better illustrate other parts.

With particular reference to FIG. 11, it is observed that the trajectory B of each conveyance channel 26 is advantageously radial with respect to the main extension axis A.

Each of the separate conveyance channels 26 is in communication with the light signaling device 1 exterior by means of the inlet section 27 thereof, and is in communication with the lower opening 8 of the inner channel 7 by means of the outlet section 28 thereof.

In particular, each separate conveyance channel 26 is extended from its inlet section 27 to its outlet section 28 in a separated manner with respect to the other conveyance channels 26.

Preferably, each conveyance channel 26 terminates, with its outlet section 28, at the lower opening 8 of the inner channel 7 of the tubular body 2.

Operatively, the lower air conveyor 25 forces, in the inner channel 7 of the tubular body 2 through the conveyance channels 26, an air flow that hits the lower air conveyor 25 transversely with respect to the main extension axis A of the tubular body 2.

This air flow forced in the inner channel 7 increases the speed of the aforesaid ascending flow in the inner channel 7 and thus increases the cooling effect via convection that such ascending flow actuates with regard to the tubular body 2, in order to cool the LEDs 15.

In particular, the air that enters into each conveyance channel 26, through the inlet section 27 of the latter, follows the length of such conveyance channel 26 up to the corresponding outlet section 28 communicating with the lower opening 8 of the inner channel 7 of the tubular body 2.

In this manner, advantageously, the air which flows into each conveyance channel 26 cannot penetrate from the latter into the other conveyance channels 26 of the lower air conveyor 25, and is therefore completely inserted in the inner channel 7 of the tubular body 2. The arrangement of separate conveyance channels 26 according to the invention in substance prevents part of the air entering into one of the conveyance channels 26 from exiting through the other conveyance channels 26 without reaching the inner channel 7.

Operatively, when the air flow transversely hits the lower air conveyor 25, such air flow penetrates into the conveyance channels 26 and from these is forced into inner channel 7 of the tubular body 2.

This air flow forced to cross through the inner channel 7 laps the dissipation fins 24 and cools them via convection.

Figure 6:
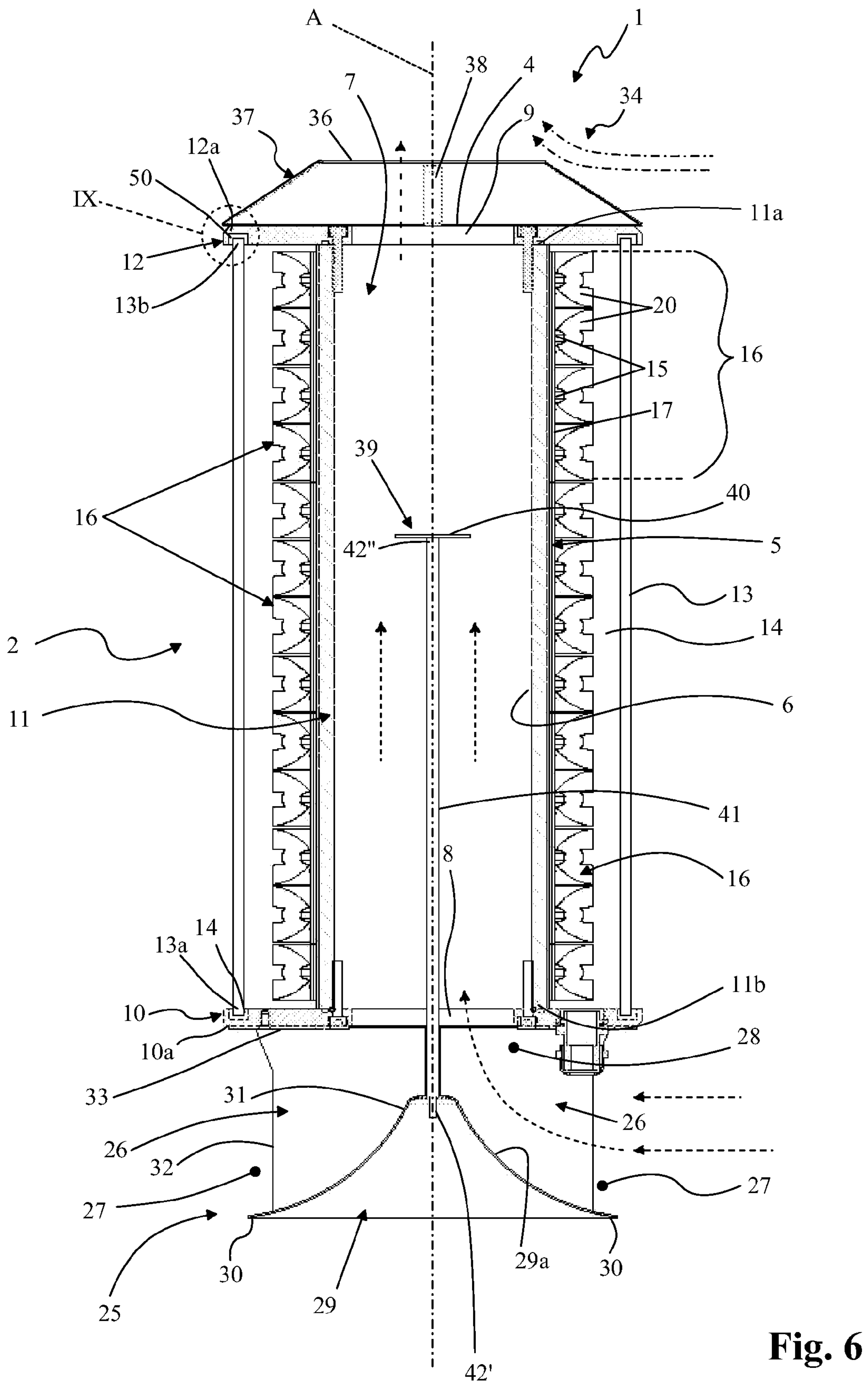
FIG. 6 illustrates a section of the light signaling device of FIG. 1, executed according to the plane VI-VI of FIG. 5, with the dissipation fins inside the tubular body not illustrated in order to better illustrate the other parts of the light signaling device.
Figure 7:
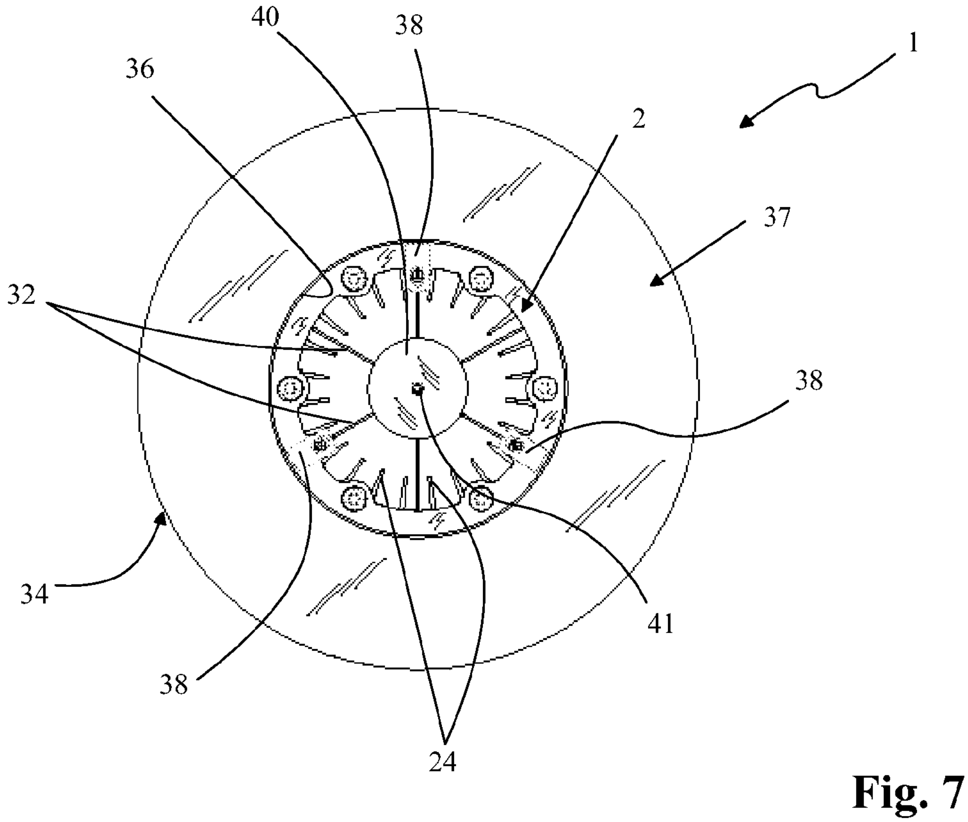
FIG. 7 illustrates the light signaling device of FIG. 1 in top plan view.
Figure 8:
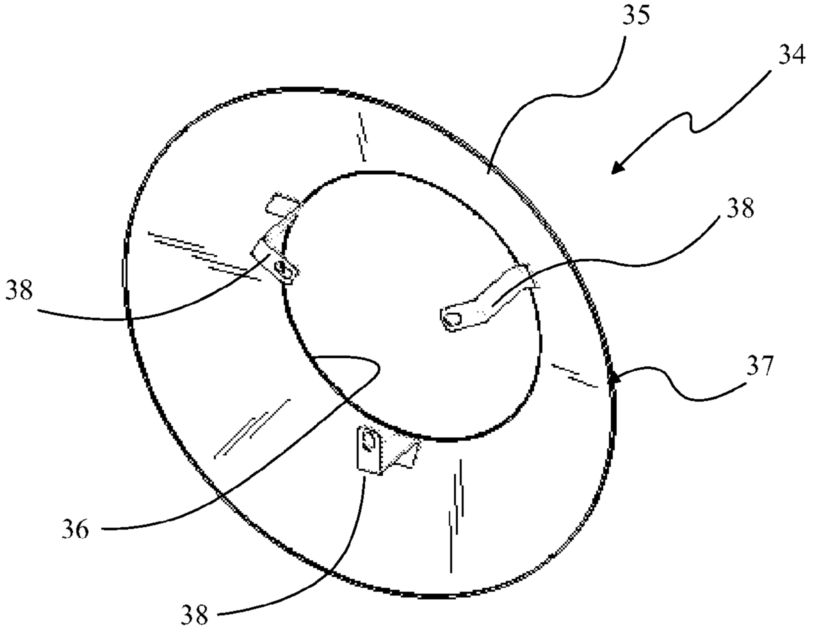
FIG. 8 illustrates, in perspective view, a particular detail of the light signaling device of FIG. 1 relative to the upper air conveyor.

In FIG. 6, as a non-limiting example, the path of an air flow that hits and crosses through the light signaling device 1 is illustrated with dashed line arrows.

It is observed that the lower air conveyor 25 is preferably symmetrical with respect to the main extension axis A of the tubular body 2, and the inlet sections 27 of the conveyance channels 26 are advantageously organized circumferentially around the main extension axis A in order to convey, in the inner channel 7 of the tubular body 2, each air flow that hits the lower air conveyor 25 from any one direction transverse to the main extension axis A.

Advantageously, the inlet section 27 of each conveyance channel 26 is positioned substantially parallel to the main extension axis A of the tubular body 2 in order to facilitate the entrance of the air flow which transversely hits the light signaling device 1.

The outlet sections 28 of the conveyance channels 26 are preferably organized around the main extension axis A and advantageously are extended on a plane perpendicular to the main extension axis A.

Advantageously, each of the conveyance channels 26 is extended, for at least one section thereof, according to the trajectory B having point by point tilt with at least one component orthogonal to the main extension axis A of the tubular body 2 and with at least one component parallel to the main extension axis A.

More in detail, in accordance with the embodiment illustrated in the enclosed figures, each conveyance channel 26 is extended from the inlet section 27 thereof according to its trajectory B tilted upward and towards the central extension axis A, terminating with its outlet section 28 at the lower opening 8 of the inner channel 7 of the tubular body 2.

The lower air conveyor 25 preferably comprises an inductive cone 29 which is extended, tapered, along the main extension axis A from a base portion 30 thereof to a tip portion 31 thereof.

The tip portion 31 projects towards the lower opening 8 of the tubular body 2.

In particular, the inductive cone 29 is provided with a conveyance surface 29*a* which is turned towards the lower opening 8 of the tubular body 2 and delimits on the lower part the conveyance channels 26 of the lower air conveyor 25.

The lower air conveyor 25 advantageously also comprises conveyor fins 32 mechanically fixed to the conveyance surface 29*a* of the inductive cone 29, from which they are extended substantially up to the lower edge 3 of the tubular body 2, laterally limiting the conveyance channels 26.

In accordance with the embodiments illustrated in the enclosed figures, the lower air conveyor 25 preferably comprises six aforesaid conveyor fins 32 which therefore delimit six conveyance channels 26.

The conveyance channels 26 advantageously have the inlet sections 27 at the base portion 30 of the inductive cone 29 and the outlet sections 28 in proximity to the tip portion 31 of the inductive cone 29.

Advantageously, the conveyance channels 26 narrow along their extension from the inlet sections 27 to the outlet sections 28, in order to accelerate the air flow that they convey to the inner channel 7 of the tubular body 2.

The conveyance surface 29*a* of the inductive cone 29 is extended, tapered, from the base portion 30 to the tip portion 31 and is advantageously provided with at least one concavity turned towards the light signaling device 1 exterior.

Preferably, in accordance with the embodiments illustrated in the enclosed figures, the conveyance surface 29*a* of the inductive cone 29 is extended around the main extension axis A with a circular arc generatrix.

In an alternative embodiment of the present invention, not illustrated in the enclosed figures, the conveyance surface 29*a* of the inductive cone 29 is advantageously a conical surface with a generatrix which, along its extension from the base portion 30 to the tip portion 31, is constituted by a rectilinear segment and by a successive concave segment.

Advantageously, the conveyor fins 32 of the lower air conveyor 25 are distributed at regular angular intervals along a circumferential direction with respect to the main extension axis A of the tubular body 2.

Preferably, the conveyor fins 32 are arranged radially with respect to the main extension axis A of the tubular body 2, and in particular are extended vertically from the conveyance surface 29*a* of the inductive cone 29, terminating with their upper edge substantially at the lower edge 3 of the tubular body 2.

Advantageously, in accordance with the embodiments illustrated in the enclosed figures, the conveyor fins 32 are joined together at the main extension axis A of the tubular body 2, in a manner such to separate each of the conveyance channels 26 along the extension thereof, so as to prevent the air that enters into one of the conveyance channels 26 from being inserted into the other conveyance channels 26.

In accordance with a different non-illustrated embodiment, the tip portion 31 of the inductive cone 29 is extended at least up to the upper edge of the conveyor fins 32, also in this manner obtaining a separation of the conveyance channels 26 along their length.

The lower air conveyor 25 preferably also comprises a ring flange 33 which is mechanically fixed to the conveyor fins 32 and mechanically connected to the lower edge 3 of the tubular body 2, and is adapted to connect the lower air conveyor 25 to the tubular body 2, e.g. by means of screws or bolts.

Advantageously, the ring flange 33 is coaxial with respect to the main extension axis A and it faces the conveyance surface 29*a* of the inductive cone 29.

The ring flange 33 conveniently delimits the conveyance channels 26 on the upper part and preferably has a central hole 33*a* which delimits, circumferentially with respect to the main extension axis A, the outlet sections 28 of the conveyance channels 26.

The light signaling device 1 according to the present invention advantageously also comprises an upper air conveyor 34 mechanically connected to the tubular body 2 above the upper opening 9 of the inner channel 7.

The upper air conveyor 34 has an outer face 35 with substantially frustoconical shape and tapered upward. The upper air conveyor 34 is also provided with a central through opening 36 which is centered on the upper opening 9 of the inner channel 7 and is in communication with the inner channel 7 by means of the upper opening 9 itself.

Operatively, the upper air conveyor 34 is susceptible of generating aerodynamic reduced pressure on the upper opening 9 of the inner channel 7 when an air flow hits the upper air conveyor 34 transversely with respect to the main extension axis A.

This aerodynamic reduced pressure is susceptible of sucking the air present in the inner channel 7 of the tubular body 2, generating a draft effect.

More in detail, the upper air conveyor 34 advantageously comprises a frustoconical annular sheet 37 which is coaxial to the main extension axis A of the tubular body 2 and externally defines the outer face 35 and internally defines the central through opening 36.

In addition, the upper air conveyor 34 preferably also comprises connection brackets 38 mechanically connected to the frustoconical annular sheet 37 and to the upper edge 4 of the tubular body 2, in order to maintain the frustoconical annular sheet 37 mechanically fixed to the tubular body 2.

Figure 9:
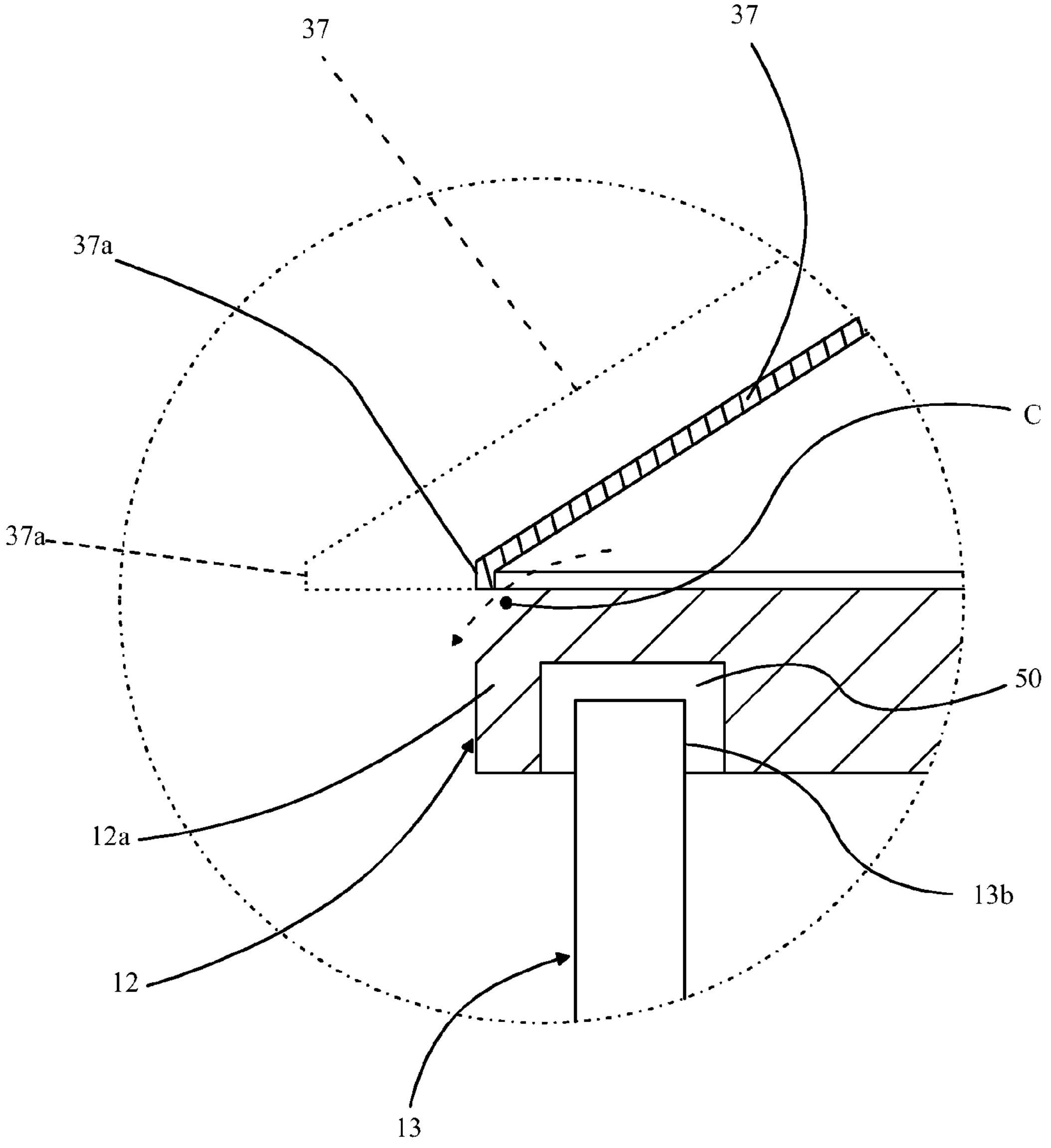
FIG. 9 is an enlarged view of the particular detail IX of FIG. 6.
Figure 10:
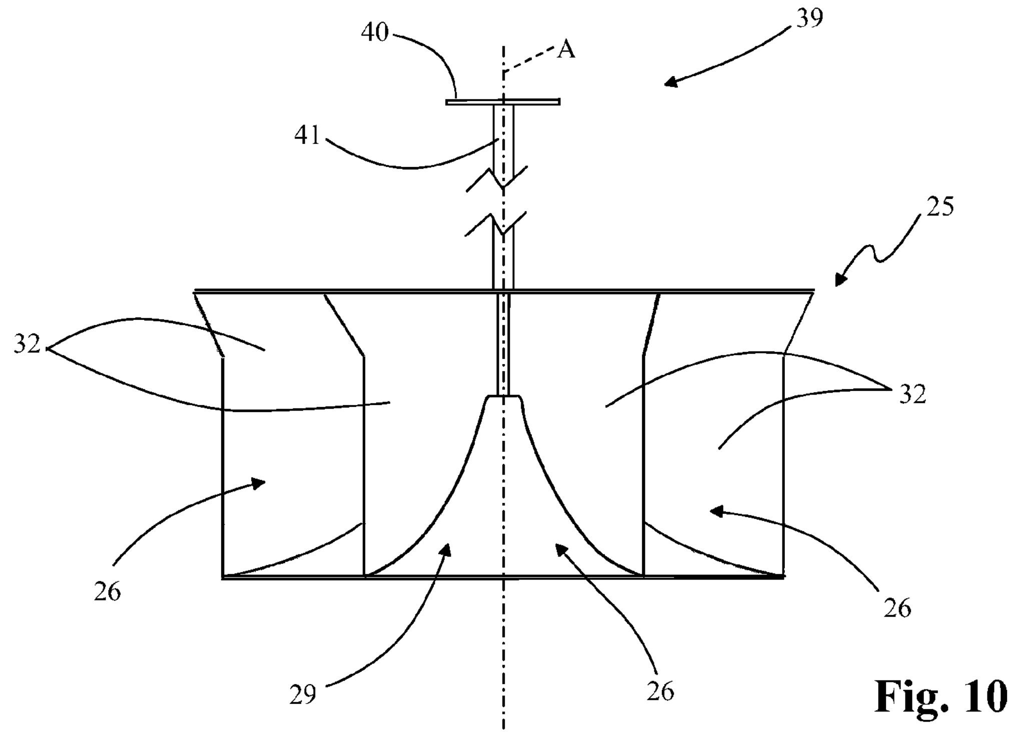
FIG. 10 illustrates, in side elevation view, a particular detail of the light signaling device of FIG. 1 relative to the lower air conveyor.

With particular reference to FIG. 9, the upper air conveyor 34 advantageously has an external perimeter lip 37*a* of the frustoconical annular sheet 37 which substantially has the same extension, with respect to the main extension axis A, as the perimeter edge 12*a* of the second annular flange 12, in order to induce the rainwater (which during rainy precipitation drips from the frustoconical annular sheet 37) to lap the cylindrical sheet 13 so as to wash it.

In addition, between the aforesaid external perimeter lip 37*a* and the perimeter edge 12*a* of the second annular flange 12, which are separated from each other, a drain passage C is conveniently defined for the water which during rainy or snowy precipitation penetrates between the frustoconical annular sheet 37 and the second annular flange 12.

As a non-limiting example, the path of a water flow that crosses the drain passage C is illustrated in FIG. 9 with a dashed line arrow.

In a further embodiment of a light signaling device, according to the present invention, susceptible to being advantageously installed in sites where it frequently snows, the extension of the external perimeter lip 37*a* with respect to the main extension axis A is preferably greater than the extension of the perimeter edge 12*a* with respect to the main extension axis A, in order to protect the cylindrical sheet 13 from the snow and prevent this from limiting the permeability of the cylindrical sheet 13 to the light emitted by the LEDs 15.

In FIG. 9, as a non-limiting example, the position of a frustoconical annular sheet 37 in the aforesaid alternative embodiment is illustrated with a dashed line.

The frustoconical annular sheet 37 is preferably made of metal material susceptible to thermally shielding the tubular body 2 when the light signaling device 1 is installed in proximity to intense heat sources, such as near the mouth of smokestack or stack.

Continuing now with the analysis of the fluid-dynamic functioning of the upper air conveyor 34, when the latter is hit by an air flow transverse to the main extension axis A, this air flow is deflected by the outer face 35.

Such deflected air flow moves above the central through opening 36 and generates the aforesaid aerodynamic reduced pressure that sucks the air present in the inner channel 7 of the tubular body 2 through the central through opening 36.

This sucked air present in the inner channel 7 tends to quickly leave the inner channel 7, bringing therewith the heat exchanged with the tubular body 2, in order to cool the LEDs 15. Illustrated in FIG. 6 by means of arrows with dash-dot line, as a non-limiting example, is an air flow that hits the upper air conveyor 34 and which is deflected above the central through opening 36 by the outer face 35.

Overall, the aerodynamic functioning of a light signaling device 1 according to the present invention is the following.

When an air flow hits the light signaling device 1 transversely with respect to the main extension axis A of the tubular body 2, a part of such air flow that hits the lower air conveyor 25 is forced by the latter into the inner channel 7 of the tubular body 2.

Another part of this air flow, which hits the upper air conveyor 34, is deflected by the latter and generates the aforesaid aerodynamic reduced pressure that sucks air from the inner channel 7 itself.

Therefore, during the functioning of the light signaling device 1, the air present in the inner channel 7 flows through the latter very quickly, thus allowing a more efficient heat exchange via convection with respect to what occurs in the described conventional light signaling devices, since such air is thrust by the air flow forced by the lower air conveyor 25 and is sucked by the aforesaid reduced pressure generated by the upper air conveyor 34.

In other words, the lower air conveyor 25 and the upper air conveyor 34 collaborate to force the air flow through the inner channel 7 of the tubular body 2, in order to cool the latter via convection when the tubular body 2 is heated by the LEDs 15 when these are functioning, obtaining an LED 15 cooling efficiency much greater than that obtained today in the above-described conventional light signaling devices.

Advantageously, the light signaling device 1 also comprises means for generating fluid-dynamic turbulence 39 arranged inside the inner channel 7 of the tubular body 2, in order to induce turbulence in the aforesaid air flow which flows through the inner channel 7.

Preferably, the means for generating fluid-dynamic turbulence 39 comprise at least one disc 40 which partially obstructs the inner channel 7 of the tubular body 2.

Functionally, when the disc 40 is hit by an air flow that flows through the channel 7 of the tubular body 2, such air flow is deflected by the disc 40 which generates, downstream of its position, a turbulent trail in the aforesaid air flow.

This turbulent trail increases the heat exchange via convection between the aforesaid air flow and the dissipation fins 24.

More in detail, the light signaling device 1 advantageously comprises a support rod 41 for the disc 40.

Such support rod 41 has a first end 42' which is preferably mechanically fixed to the tip portion 31 of the inductive cone 29.

The support rod 41 is extended in the inner channel 7 of the tubular body 2 along the main extension axis A, and supports, in an intermediate position of the inner channel 7, the disc 40 which is mechanically fixed to the support rod 41, preferably at a second end 42" of the support rod 41 opposite the first end 42'.

In a variant embodiment of the light signaling device 1, this also comprises a wind fan, per se entirely conventional and therefore not illustrated in the enclosed figures.

This wind fan is advantageously mechanically fixed to the tubular body 2 with a suction mouth thereof superimposed on the upper opening 9 of the inner channel 7 in order to suck an air flow through the inner channel 7, so as to cool the LEDs 15 via convection.

Advantageously, the light signaling device 1 also comprises a support, not illustrated in the enclosed figures.

Such support is mechanically fixed on the lower part to the lower air conveyor 25 and is susceptible to being fixed above to a support intended to be marked by the light signaling device 1, in order to separate the lower air conveyor 25 from the turbulence zone generated near said support when the latter is hit by an air flow.

Preferably, the light signaling device 1 also comprises a sheet which is mechanically fixed on the lower part to the lower air conveyor 25 and is susceptible to being arranged above at one edge of the aforesaid support.

The aforesaid sheet is extended in at least one direction radial to the main extension axis A, projecting beyond the bulk of the lower air conveyor 25, in order to shield the latter from a turbulent air flow deflected by such support towards the lower air conveyor 25.

Preferably, such sheet is provided with an end lip curved downward in order to reduce the turbulence generated by such air flow deflected by the aforesaid support towards the lower air conveyor 25.

Figure 12:
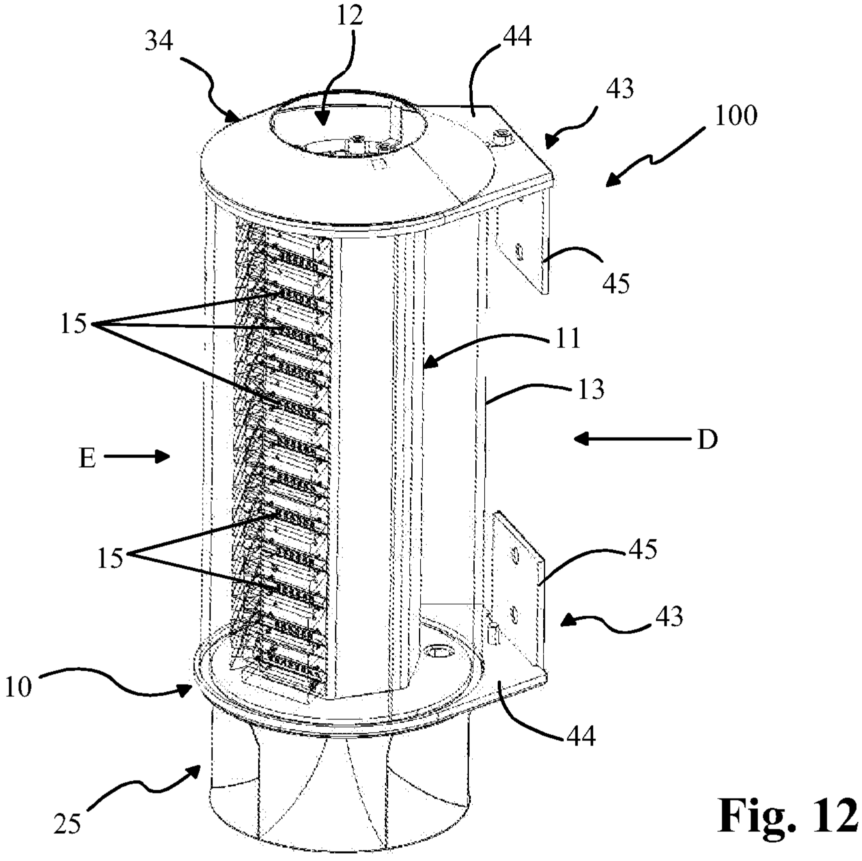
FIG. 12 illustrates, in perspective view, a light signaling device according to a second embodiment of the present invention, which has a tubular body that is internally provided with dissipation fins.
Figure 13:
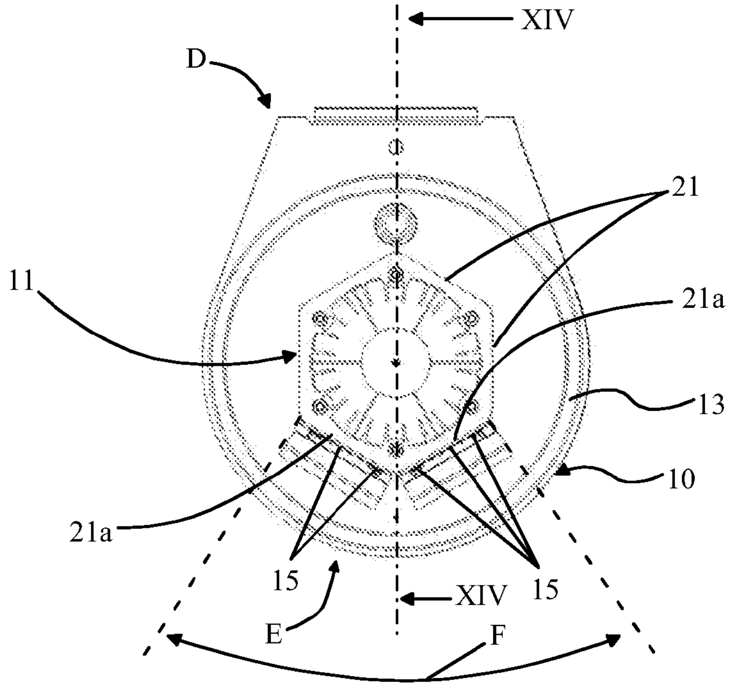
FIG. 13 illustrates, in top plan view, the light signaling device illustrated in FIG. 12 with several parts removed in order to better illustrate other parts.
Figure 14:
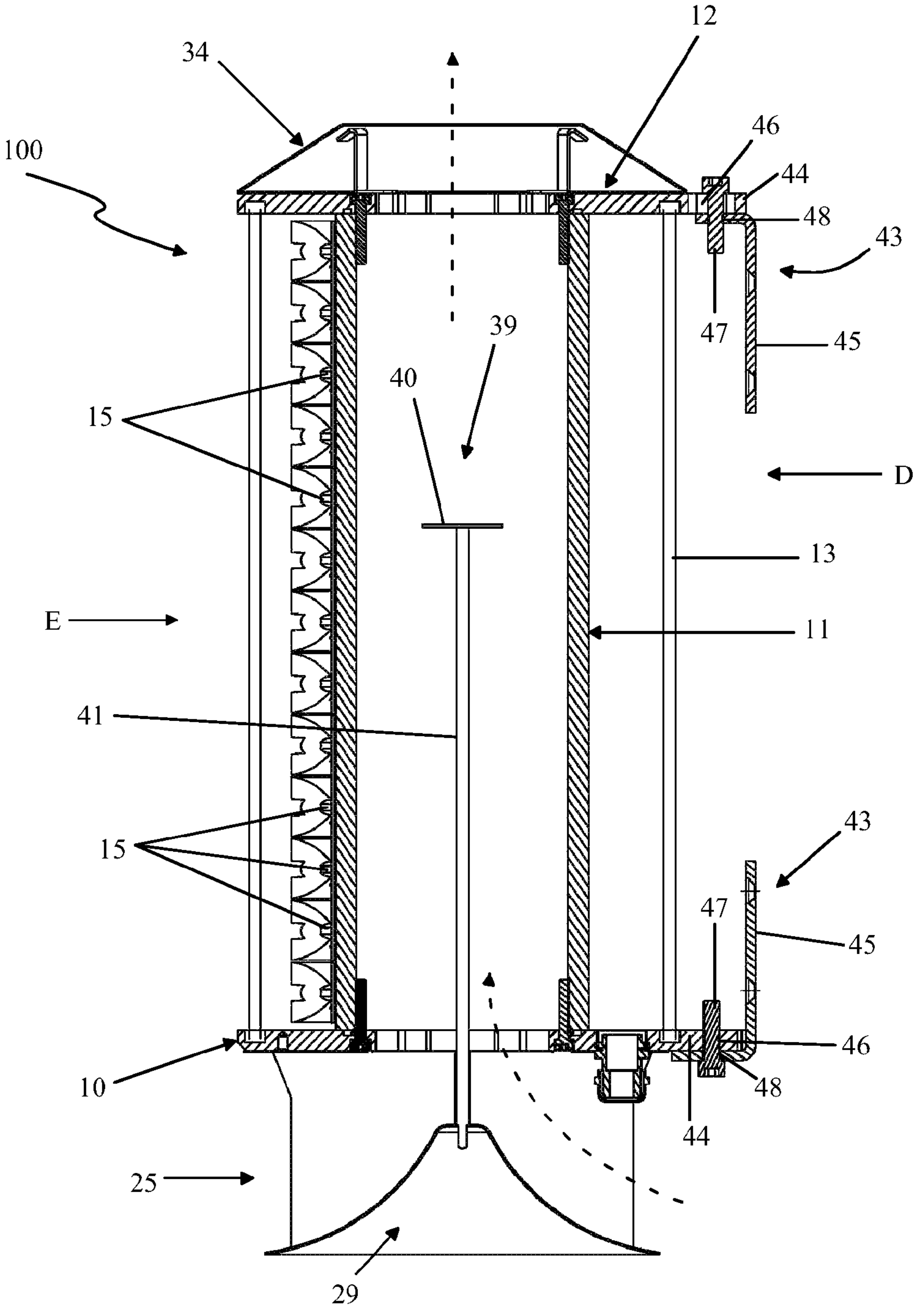
FIG. 14 illustrates a section of the light signaling device illustrated in FIG. 14, executed along the plane XIV-XIV of FIG. 13, with the dissipation fins inside the tubular body not illustrated in order to better illustrate the other parts.

The present invention is also susceptible to being achieved in a second embodiment of a light signaling device which is illustrated as a non-limiting example in FIGS. 12, 13 and 14, in which it is indicated in its entirety with the reference number 100.

For consultation simplicity, the parts and the components of the light signaling device 100 are indicated with the same reference numbers as the corresponding parts and components of the light signaling device 1.

Described below are the main structural differences between the light signaling device 100 and the light signaling device 1.

The light signaling device 100 in this second embodiment is advantageously susceptible to being fixed to the sides of an aeronautical obstacle to be signaled, such as a tower, a pylori, a smokestack and generally a structure on which the light signaling device 100 cannot be fixed at the top but must be fixed to the sides of the top.

In particular, in order to mark an aeronautical obstacle, four light signaling devices 100 are advantageously fixed in opposite positions.

The light signaling device 100 advantageously comprises fixing brackets 43 which are mechanically fixed to the side of the tubular body 2 and are susceptible to being mechanically fixed to the side of the aforesaid obstacle which is intended to be marked by light signaling device 100.

Preferably, the fixing brackets 43 comprise a first bracket part 44 and a second plate part 45. The first bracket part 44 is conveniently integral with the annular flanges 10 and 12.

The second plate part 45 is mechanically connected to the first bracket part 44 and is susceptible to being regulated in its position with respect to the first bracket part 44.

In more detail, the first bracket part 44 is preferably provided with an extended hole 46 in which an adjustment screw 47 is inserted which is susceptible to being screwed in a threaded hole 48 of the second plate part 45, in order to lock the latter with respect to the first bracket part 44.

The fixing brackets 43 are organized on a first side D of the light signaling device 100 which has the LEDs 15 arranged on only a second side E thereof, opposite the first side D.

More in detail, the LEDs 15 are fixed on two front flat faces 21*a* of the flat faces 21 of the tubular portion 11; such front flat faces 21*a* are organized on the second side E of the light signaling device 100.

The LEDs 15 are supported by the front flat faces 21*a* and are susceptible of generating a light beam that has an angular opening F with respect to the main extension axis A; such angular opening F is substantially equal to 120°, so that four light signaling devices 100 fixed to the four opposite sides of the aforesaid obstacle emit a light signal that is extended over 360° around such obstacle.

In practice, it has been established that a light signaling device according to the finding attains the preset task and objects.

The invention claimed is:

1. Light signaling device comprising:

a tubular body (2) which has a lower edge (3) and an upper edge (4) and is extended between said lower edge (3) and said upper edge (4) along a main extension axis (A);

said tubular body (2) also has an outer surface (5) and an inner surface (6) which defines an inner channel (7) inside said tubular body (2);

said inner channel (7) has a lower opening (8) arranged at said lower edge (3), and an upper opening (9) arranged at said upper edge (4);

LEDs (15) mechanically connected to the outer surface (5) of said tubular body (2), said LEDs (15) dissipating heat via conduction through said tubular body (2);

a lower air conveyor (25) which is mechanically connected to the lower edge (3) of said tubular body (2), partially closes the lower opening (8) of the inner channel (7) of said tubular body (2) and is provided with a plurality of separate conveyance channels (26), each of which extended between an inlet section (27) thereof and an outlet section (28) thereof according to a trajectory (B) which has at least one component radial with respect to said main extension axis (A), each of said separate conveyance channels (26) being in communication with the exterior of said light signaling device by means of said inlet section (27) and each of said separate conveyance channels (26) being in communication with the lower opening (8) of said inner channel (7) by means of said outlet section (28), said lower air conveyor (25) forcing in the inner channel (7) of said tubular body (2), through said separate conveyance channels (26), an air flow that hits said lower air conveyor (25) transversely with respect to the main extension axis (A) of said tubular body (2), in order to cool said LEDs (15) via convection.

2. Light signaling device according to claim 1, wherein each of said conveyance channels (26) is extended for at least one section thereof according to said trajectory (B), having point by point tilt with at least one component orthogonal to the main extension axis (A) of said tubular body (2) and with at least one component parallel to said main extension axis (A).

3. Light signaling device according to claim 1, wherein each of said conveyance channels (26) narrows along its extension from said inlet section (27) to said outlet section (28).

4. Light signaling device according to claim 1, wherein the inlet section (27) of each said conveyance channel (26) is positioned substantially parallel to the main extension axis (A) of said tubular body (2) in order to facilitate the entrance of said air flow in said conveyance channel (26).

5. Light signaling device according to claim 1, wherein said lower air conveyor (25) comprises:

an inductive cone (29) provided with a tip portion (31) projecting towards the lower opening (8) of said tubular body (2) and with a conveyance surface (29*a*) which is turned towards the lower opening (8) of said tubular body (2) and delimits said conveyance channels (26) on the lower part;

conveyor fins (32) mechanically fixed to the conveyance surface (29*a*) of said inductive cone (29), from which they are extended substantially up to the lower edge (3) of said tubular body (2), laterally delimiting said conveyance channels (26).

6. Light signaling device according to claim 5, wherein said conveyor fins (32) are arranged radially with respect to the main extension axis (A) of said tubular body (2).

7. Light signaling device according to claim 5, wherein the conveyance surface (29*a*) of said inductive cone (29) is provided with at least one concavity.

8. Light signaling device according to claim 7, wherein the conveyance surface (29*a*) of said inductive cone (29) is extended around said main extension axis (A) with a circular arc generatrix.

9. Light signaling device according to claim 5, wherein said lower air conveyor (25) further comprises a ring flange (33) mechanically fixed to said conveyor fins (32) and mechanically connected to the lower edge (3) of said tubular body (2);

said ring flange (33) is coaxial to said main extension axis (A) and faces the conveyance surface (29*a*) of said inductive cone (29).

10. Light signaling device according to claim 1, further comprising an upper air conveyor (34) mechanically connected to said tubular body (2) above the upper opening (9) of said inner channel (7);

said upper air conveyor (34) has an outer face (35) with substantially frustoconical shape and tapered upward, and a central through opening (36) which is centered on the upper opening (9) of said inner channel (7);

said upper air conveyor (34) generating aerodynamic reduced pressure on the upper opening (9) of said inner channel (7) when an air flow hits said upper air conveyor (34) transversely with respect to said main extension axis (A), in order to suck the air present in said inner channel (7).

11. Light signaling device according to claim 10, wherein said upper air conveyor (34) comprises:

a frustoconical annular sheet (37) which is coaxial to the main extension axis (A) of said tubular body (2) and externally defines said outer face (35) and internally defines said central through opening (36);

connection brackets (38) mechanically connected to said frustoconical annular sheet (37) and to the upper edge (4) of said tubular body (2).

12. Light signaling device according to claim 1, further comprising a means for generating fluid-dynamic turbulence (39) arranged inside the inner channel (7) of said tubular body (2) in order to induce turbulence in an air flow which flows through said inner channel (7).

13. Light signaling device according to claim 12, further comprising said means for generating fluid-dynamic turbulence (39) comprise at least one disc (40) which partially obstructs the inner channel (7) of said tubular body (2).

14. Light signaling device according to claim 13, further comprising a support rod (41) for said at least one disc (40);

said support rod (41) has a first end (42') which is mechanically fixed to the tip portion (31) of said inductive cone (29), and said support rod (41) is extended in the inner channel (7) of said tubular body (2) along said main extension axis (A);

said at least one disc (40) being mechanically fixed to said support rod (41) in an intermediate position of said inner channel (7).

15. Light signaling device according to claim 1, further comprising a wind fan mechanically fixed to said tubular body (2) above the upper opening (9) of said inner channel (7) and adapted to suck an air flow through said inner channel (7) in order to cool said LEDs (15) via convection.

* * * * *